(12) United States Patent
Ohgami et al.

(10) Patent No.: US 7,903,489 B2
(45) Date of Patent: Mar. 8, 2011

(54) SEMICONDUCTOR DEVICE HAVING A SENSE AMPLIFIER

(75) Inventors: Takeshi Ohgami, Tokyo (JP); Seiji Narui, Tokyo (JP)

(73) Assignee: Elpida Memory, Inc., Tokyo (JP)

(*) Notice: Subject to any disclaimer, the term of this patent is extended or adjusted under 35 U.S.C. 154(b) by 459 days.

(21) Appl. No.: 11/763,772

(22) Filed: Jun. 15, 2007

(65) Prior Publication Data
US 2008/0008013 A1     Jan. 10, 2008

(30) Foreign Application Priority Data
Jul. 10, 2006   (JP) ............................. 2006-188833

(51) Int. Cl.
   *G11C 7/02*   (2006.01)
(52) U.S. Cl. ...................... 365/208; 365/205
(58) Field of Classification Search ............... 365/208, 365/205, 207 X, 208 O
   See application file for complete search history.

(56) References Cited

U.S. PATENT DOCUMENTS

| | | | |
|---|---|---|---|
| 5,895,956 A | 4/1999 | Oowaki et al. | |
| 6,538,946 B2 | 3/2003 | Arai et al. | |
| 6,671,217 B2 | 12/2003 | Takemura et al. | |
| 6,700,169 B2 | 3/2004 | Kuroki | |
| 7,224,629 B2 * | 5/2007 | Akiyama et al. | ............ 365/208 |

FOREIGN PATENT DOCUMENTS

| | | |
|---|---|---|
| JP | 08-213564 | 8/1996 |
| JP | 2002-026294 | 1/2002 |
| JP | 2003-068880 | 3/2003 |
| JP | 2003-234418 | 8/2003 |
| JP | 2003-257181 | 9/2003 |
| JP | 2005-347578 | 12/2005 |

OTHER PUBLICATIONS

Japanese Office Action with English translation.

* cited by examiner

*Primary Examiner*—Michael B Shingleton
(74) *Attorney, Agent, or Firm*—Whitham Curtis Christofferson & Cook, PC

(57) ABSTRACT

A semiconductor device in the present invention comprises pair transistors composed of a first transistor and a second transistor. The pair transistors are arrayed in a repeating pattern in the row direction. The first transistor and the second transistor are mutually related to each other so that the drain of one transistor is connected to the gate of the other transistor. The gate of the first transistor and the gate of the second transistor are offset in the row direction. The first transistor and the second transistor are in a diagonal positional relationship.

19 Claims, 8 Drawing Sheets

SEMICONDUCTOR DEVICE HAVING A SENSE AMPLIFIER

TECHNICAL FIELD

The present invention relates to a semiconductor device, and particularly relates to a layout of pair transistors constituting a sense amplifier of a DRAM (Dynamic Random Access Memory).

BACKGROUND OF THE INVENTION

A sense amplifier is used for reading data in a DRAM. The sense amplifier functions to detect and amplify small differences in electric potential between a pair of bit lines.

FIG. 6 is a circuit diagram showing the basic configuration of a sense amplifier.

As shown in FIG. 6, a sense amplifier has a pair of P channel MOS transistors Tr1 and Tr2, and a pair of N channel MOS transistors Tr3 and Tr4. Specifically, Tr1 and Tr2 constitute a single set of pair transistors, and Tr3 and Tr4 constitute a single set of pair transistors. When the bit line BLT selected from the pair of bit lines BLT and BLB is at a high potential, the bit line BLT turns on transistor Tr4 and reduces the electric potential of the bit line BLB. The electric potential of the bit line BLT increases because the on electric current of the transistor Tr1 is thereby increased. An inverse operation is carried out when the electric potential relationship between BLT and BLB is inverted. The small difference in electric potential between the pair of bit lines BLT and BLB is amplified by the above operation.

The effect that the size of a sense amplifier has on the size of the entire chip is considerable because a sense amplifier is required for all bit line pairs. In other words, the sense amplifier is one circuit in particular that needs to be reduced in size. The sense amplifier functions to detect and amplify small differences in electric potential between bit lines. The small difference in electric potential corresponds to the electric charge held in a memory cell, and since this difference is very small, a balanced design in terms of resistance and capacitance in the pair of bit lines is required in order to correctly amplify the difference. If such a balance is not obtained, data may become inverted, and other critical DRAM failures may occur. Therefore, the balance between bit lines in the design of a sense amplifier must be given considerable attention.

A layout of pair transistors in a sense amplifier is disclosed in Japanese Laid-open Patent Application No. 2005-347578. The conventional layout of a sense amplifier disclosed in Japanese Laid-open Patent Application No. 2005-347578 is briefly described below.

FIG. 7 is a schematic plan view showing an example of the conventional layout of a sense amplifier.

As shown in FIG. 7, the sense amplifier 40 has a plurality of pair transistors PT composed of a combination of two transistors Tr in the active region 101, and these are disposed in correspondence with a plurality of bit lines arrayed with a uniform pitch. Specifically, the transistors Tr1 and Tr2 constitute a first pair transistor PT1, the transistors Tr3 and Tr4 constitute a second pair transistor PT2, the transistors Tr5 and Tr6 constitute a third pair transistor PT3, and the transistors Tr7 and Tr8 constitute a fourth pair transistor PT4. Such an active region 101 is provided for a P channel MOS transistor and an N channel MOS transistor, respectively (see FIG. 8 of Japanese Laid-open Patent Application No. 2005-347578).

However, progress in semiconductor technology continues to lead to smaller memory cells, and the spacing between bit lines determined by the size of the memory cell continues to narrow. For this reason, there is a need to reduce the pitch at which the pair transistors are disposed in a corresponding manner. However, with a conventional sense amplifier layout, it is becoming difficult to reduce the configurational pitch of the pair transistors in correspondence with the narrowed pitch of the bit lines. This is because a gate, an impurity diffusion layer that forms a source and drain, contacts that supply electric potential to the source and drain, and other components are required to form a transistor. In other words, the direction in which the pair transistors are arrayed (the lateral direction in the diagram) is determined by the gate, source, and drain of the pair transistors, and the size and spacing required for the configuration to function as an element are approaching their limits. Conversely, when the spacing is narrowed further to surpass these limits in terms of design, short-circuiting may occur at unintended contact points, wiring may be similarly broken if the width and size is reduced, and contacts may be interrupted.

FIG. 8 is a schematic plan view showing another example of the layout of a conventional sense amplifier.

As shown in FIG. 8, the sense amplifier 50 is the same circuit as in FIG. 7, and has four sets of pair transistors composed of transistors Tr1 to Tr8. Each set of transistors Tr1 and Tr2, Tr3 and Tr4, Tr5 and Tr6, and Tr7 and Tr8 constitutes a pair transistor, and each pair of bit lines BL1T and BL1B, bit lines BL2T and BL2B, and so forth constitutes a corresponding pair of bit lines. Among the four sets of pair transistors composed of transistors Tr1 to Tr8, the transistors Tr1, Tr2, Tr5, and Tr6 are disposed in an active region 101A of the first column, and the transistors Tr3, Tr4, Tr7, and Tr8 are disposed in an active region 101B of the second column. The position in the lateral direction of the transistors disposed in the active region 101A of the first column and the position in the lateral direction of the transistors disposed in the active region 101B of the second column are offset by a half pitch. The previously physically limited transverse wiring width, spacing, and other properties are provided with a greater degree of freedom, and a pair transistor in which the pitch of the bit lines has been reduced can be obtained (see FIG. 9 of Japanese Laid-open Patent Application No. 2005-347578).

However, in the conventional pair transistor layout shown in FIG. 8, the size in the lateral direction (row direction) is determined by the bit lines, but since the pair transistors are stacked two deep in the column direction, the size in the perpendicular direction of the pair transistors is increased.

SUMMARY OF THE INVENTION

It is therefore an object of the present invention to provide a semiconductor device in which the surface area of the layout of the pair transistors is reduced, and the entire sense amplifier can be made smaller.

The above and other objects of the present invention can be accomplished by semiconductor device comprising a plurality of pair transistors each including a first transistor and a second transistor, the pair transistors being arrayed in a repeating pattern in a row direction, wherein a drain of the first transistor is connected to a gate of the second transistor; a drain of the second transistor is connected to a gate of the first transistor; and the gates of the pair transistors are offset in the row direction and a column direction.

In a preferred aspect of the present invention, the gates of the pair transistors do not have portions that mutually overlap in the row direction. The gates of the pair transistors have portions that mutually overlap in the column direction. In another preferred aspect of the present invention, the shortest distance between the gates of the pair transistors is set to be the minimum feature size.

According to the present invention, a semiconductor device can be provided in which the size of the layout in the column direction of the pair transistor is reduced and the sense amplifier can be made smaller.

BRIEF DESCRIPTION OF THE DRAWINGS

The above and other objects, features and advantages of this invention will become more apparent by reference to the following detailed description of the invention taken in conjunction with the accompanying drawings, wherein.

DESCRIPTION OF THE PREFERRED EMBODIMENTS

Preferred embodiments of the present invention will now be described in detail hereinafter with reference to the accompanying drawings.

Figure 1:
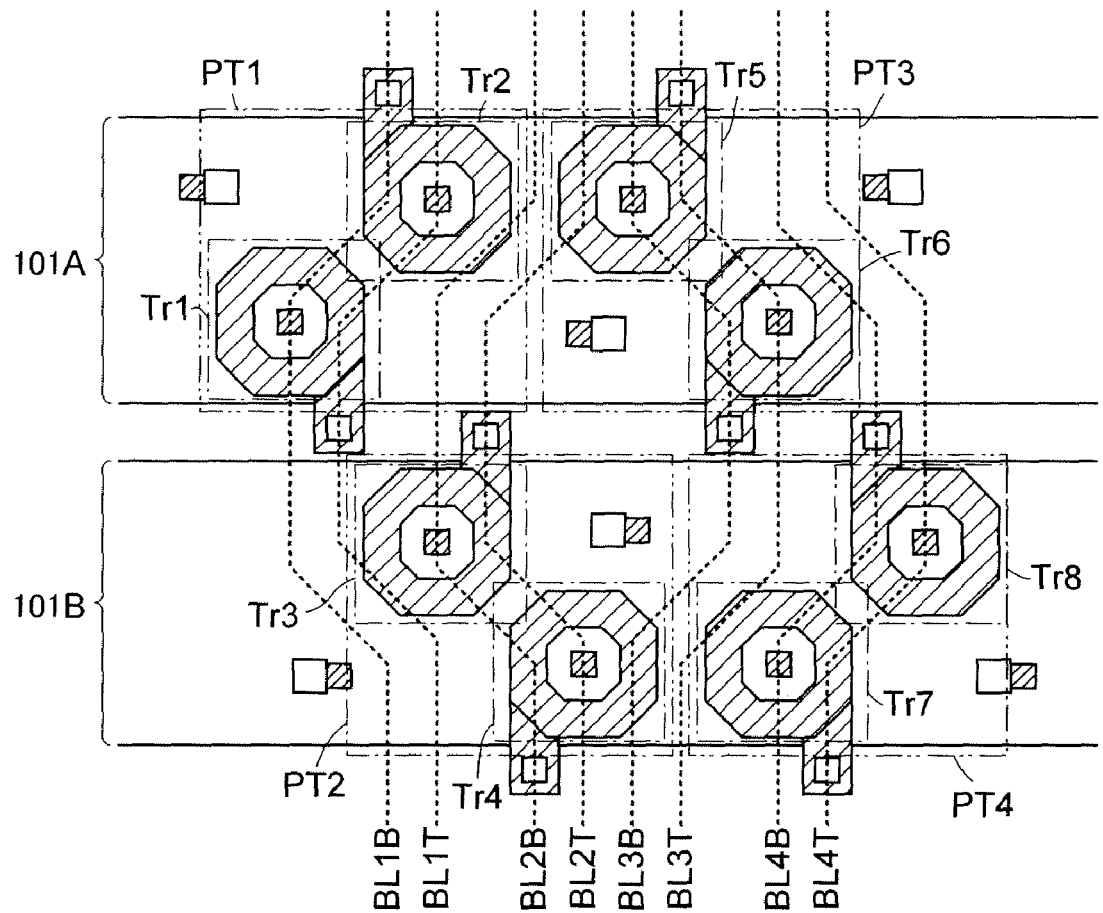
FIG. 1 is a schematic plan view of the semiconductor device according to a preferred embodiment of the present invention, and the drawing shows in detail the pair transistors in a sense amplifier of a DRAM.
Figure 2:
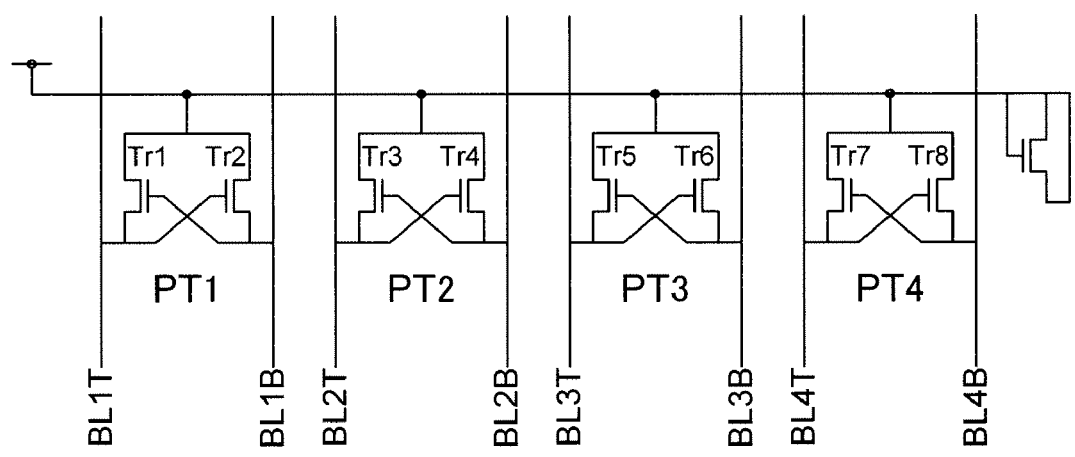
FIG. 2 is a circuit diagram of the semiconductor device 10 shown in FIG. 1.

FIG. 1 is a schematic plan view of the semiconductor device according to a preferred embodiment of the present invention, and the drawing shows in detail the pair transistors in a sense amplifier of a DRAM. FIG. 2 is a circuit diagram of the semiconductor device 10 shown in FIG. 1. In the present embodiment, only an NMOS transistor is used as an example, but since a PMOS transistor would also have the same structure, a description of a PMOS transistor has been omitted.

As shown in FIG. 1, the semiconductor device 10 is provided with first and second active regions 101A and 101B disposed on a semiconductor substrate, a plurality of NMOS transistors Tr1 and Tr2, . . . disposed in the first and second active regions 101A and 101B, respectively, and a plurality of bit line pairs BLnT and BLnB (where n is a positive integer) extending in the column direction.

In the present embodiment, eight bit lines (four sets of bit line pairs) BL1T to BL4T and BL1B to BL4B are described, but it is apparent that a larger number of bit lines may actually be present. Since a transistor corresponding to each bit line is disposed in the sense amplifier, eight transistors Tr1 to Tr8 are shown in the diagram. Among these, four transistors Tr1, Tr2, Tr5, and Tr6 (hereinafter simply referred to as transistors) are disposed in the first active region 101A, and four transistors Tr3, Tr4, Tr7, and Tr8 are disposed in the second active region 101B. Two transistors adjacent in the diagonal direction in the same active region constitute a pair transistor. Specifically, the transistors Tr1 and Tr2 constitute a first pair transistor PT1, the transistors Tr3 and Tr4 constitute a second pair transistor PT2, the transistors Tr5 and Tr6 constitute a third pair transistor PT3, and the transistors Tr7 and Tr8 constitute a fourth pair transistor PT4.

In this manner, with the semiconductor device 10 of the present embodiment, pair transistors PT are arrayed in a repeating pattern in the row direction in a single active region, constituting a group of pair transistors. In this case, when the two pair transistors PT1 and PT3 adjacent in the row direction are considered, the first pair transistor PT1 and the third pair transistor PT3 are in a bilateral symmetry (axial symmetry with respect to axis in the column direction), and such a pattern of pair transistors is formed in a repeating fashion in the row direction. Therefore, a balanced pair transistor layout can be achieved in terms of resistance and capacitance with respect to a pair of bit lines.

Two active regions 101A and 101B having such a group of pair transistors are disposed at a prescribed distance from each other in the column direction, and the group of pair transistors has a two-step configuration, whereby a layout having room for wiring and contacts is achieved. In this case, when the pattern layout of the group of pair transistors in the first active region 101A and the pattern layout of the group of pair transistors in the second active region 101B are compared, the pattern layout of the group of pair transistors in the first active region 101B are in a relationship that is substantially equivalent to one in which the group of pair transistors in the first active region 101A is offset in the row direction (the right direction in this case) by an amount commensurate to a single transistor.

Figure 3:
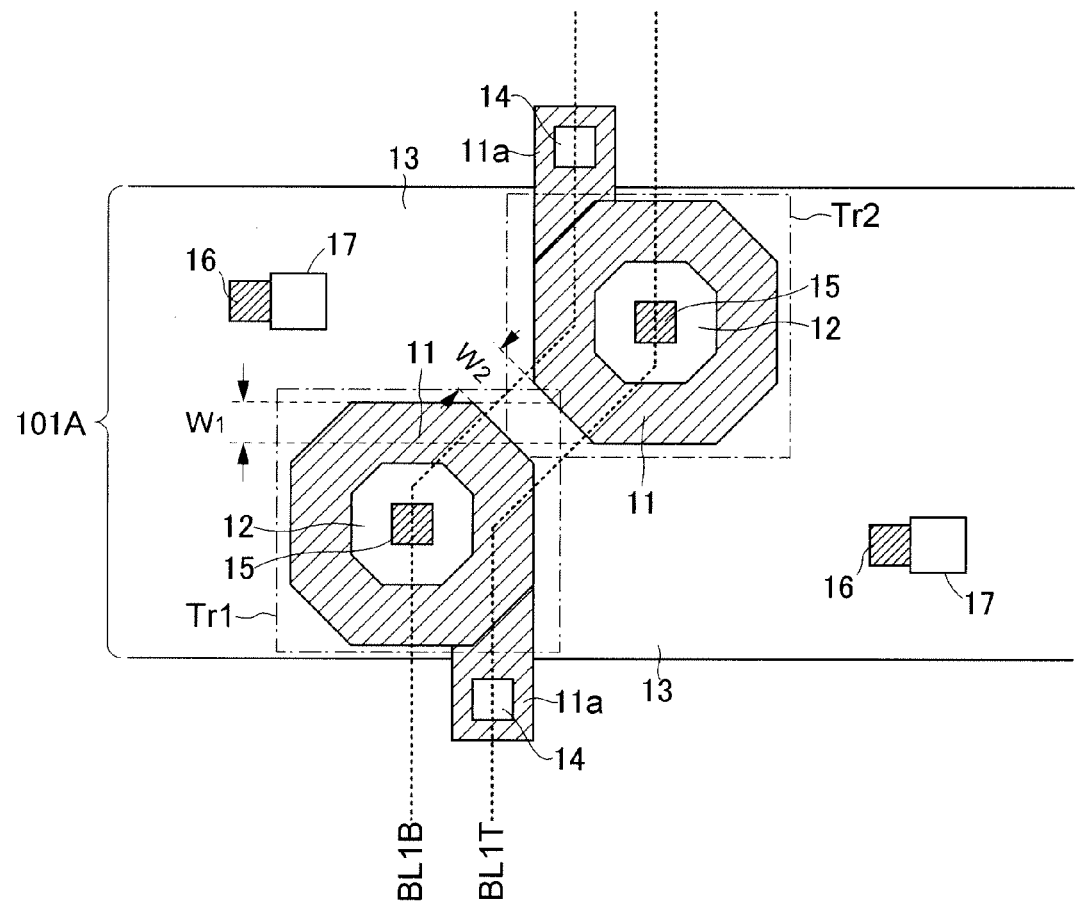
FIG. 3 is an enlarged schematic plan view showing the configuration of a pair transistor.

FIG. 3 is an enlarged schematic plan view showing the configuration of a pair transistor. Pair transistor PT1 is provided as an example in this case, but the same applies to the other pair transistors PT2 to PT4.

The two transistors Tr1 and Tr2 constituting the pair transistor PT1 both have a ring-shaped gate (hereinafter referred to as "ring gate") 11, a drain (diffusion layer) 12 formed inside the ring gate 11, and a source (diffusion layer) 13 formed outside the ring gate 11. The ring gate 11 is provided with a lead portion 11a, and a gate contact 14 is connected to the lead portion 11a, as shown in FIG. 3. The lead portion 11a is preferably brought to the outside of the active region 101A, and the gate contact 14 is preferably disposed outside the active region 101A. The gate 11 of the first transistor Tr1 is connected to the bit line BL1B by way of the gate contact 14, and the gate 11 of the second transistor Tr2 is connected to the bit line BL1T by way of the gate contact 14.

The drains 12 of the transistors Tr1 and Tr2 are connected to a bit line contact 15 disposed in the center area of the ring gate 11. Thus, the drain 12 of the first transistor Tr1 is connected to the bit line BL1B by way of the bit line contact 15. The drain 12 of the second transistor Tr2 is connected to the bit line BL1T by way of the bit line contact 15. Therefore, the drain 12 of the first transistor Tr1 is connected to the gate 11 of the second transistor Tr2 by way of the bit line BL1B, and the drain of the second transistor Tr2 is connected to the gate 11 of the first transistor Tr1 by way of the bit line BL1T. In other words, in the pair transistor, the transistors have a mutual relationship in which the drain 12 of one of the transistors is connected to the gate 11 of the other transistor.

The sources 13 of the first and second transistors Tr1 and Tr2 are connected to through-holes 17 by way of source contacts 16 disposed in prescribed positions in the diffusion layer and upper-layer wiring, and are connected to even higher layers of wiring (not shown) by way of the through-holes 17. The upper-layer wiring is connected to the power source of the sense amplifier (low electric potential side), whereby the same electric potential is supplied to the source 13 of the transistors Tr1 and Tr2. The circuit diagram of FIG. 2 shows in detail the circuit configuration of the pair transistors described above in relation to all of the pair transistors PT1 to PT4.

Next, the layout of the first and second transistors Tr1 and Tr2 constituting the pair transistor PT1 is described in detail.

Figure 7:
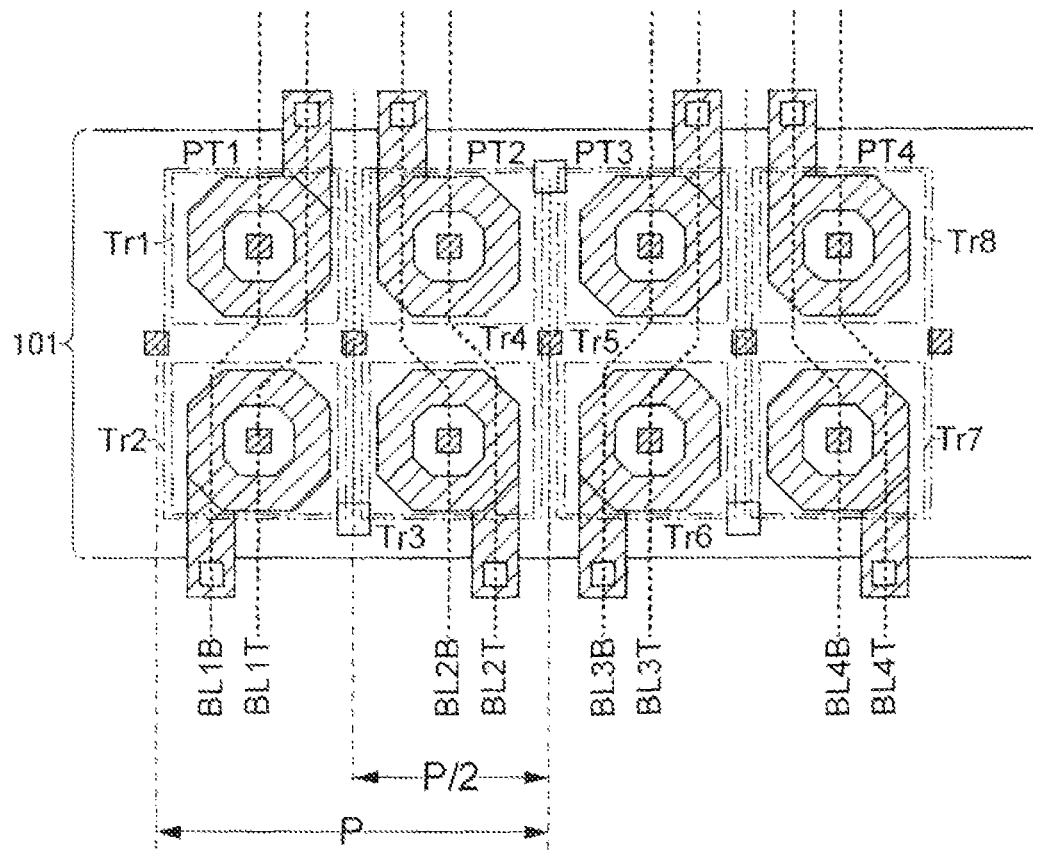
FIG. 7 is a schematic plan view showing an example of the conventional layout of a sense amplifier.
Figure 8:
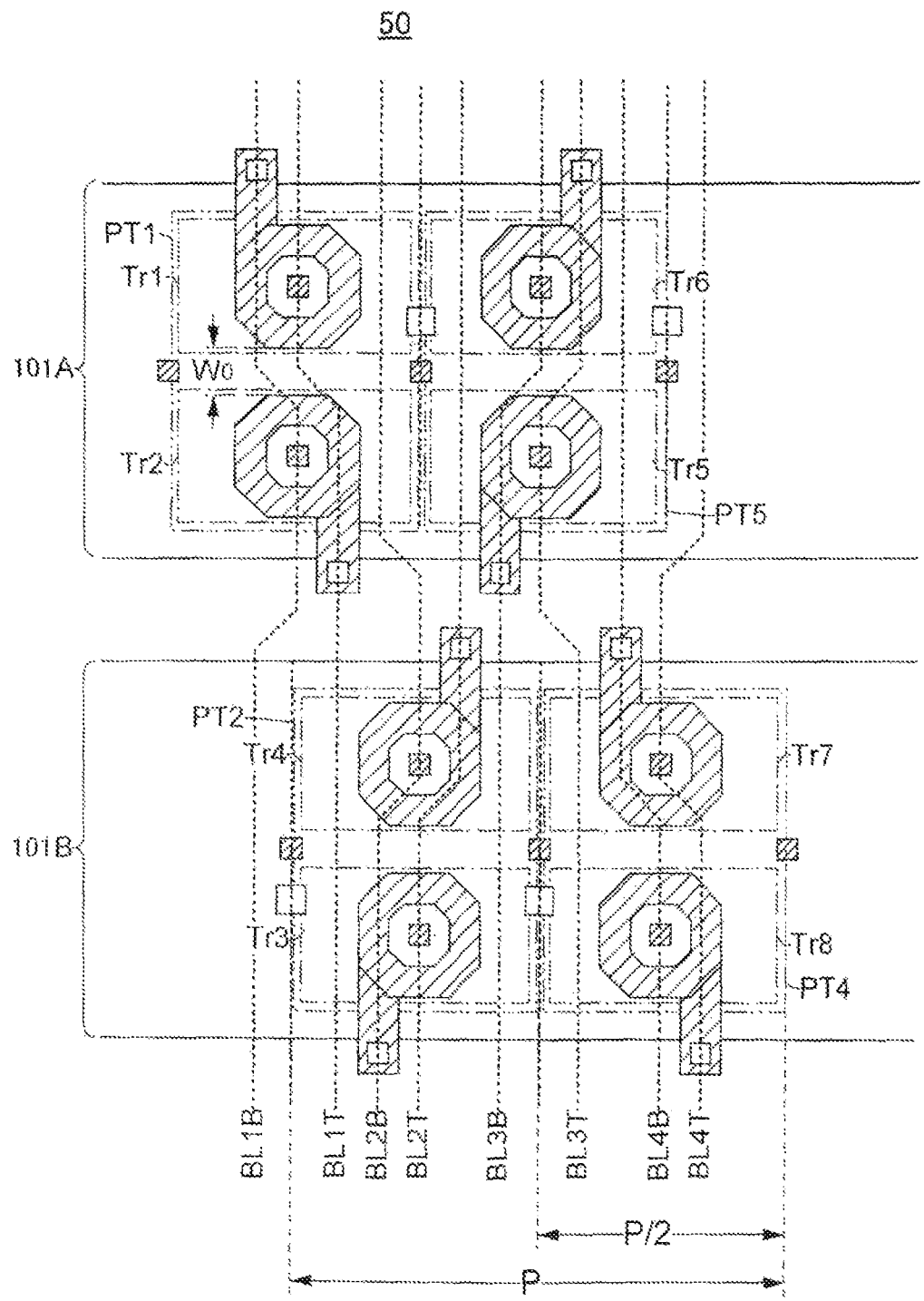
FIG. 8 is a schematic plan view showing another example of the layout of a conventional sense amplifier.

In the present embodiment, the positions in the row direction of the first transistor Tr1 and second transistor Tr2 do not match, and the ring gate 11 of Tr1 and the ring gate 11 of Tr2 are in a diagonal positional relationship to each other. In other words, the ring gates 11 of the transistors Tr1 and Tr2 are disposed so as to not overlap in the row direction and so as to have a portion W1 that mutually overlaps in the column direction. The shortest distance W2 between the ring gates 11 and 11 is set to the minimum feature size. In the conventional sense amplifier shown in FIG. 7, for example, the pair transistors are most proximate in the column direction, and the margin W0 is set to the minimum feature size. However, in accordance with the present embodiment, the width can be narrowed, in comparison with a conventional pair transistor, by (W0+W1), which includes the overlap width W1 of the ring gate 11 in addition to the margin W0 in the column direction.

Ordinarily, the layout in the row direction of a sense amplifier is restricted by the layout of bit lines, and there is little degree of freedom. Therefore, with the layout of a sense amplifier, an important factor is the degree to which the surface area in the column direction is reduced. When a group of pair transistors is given a two-step configuration as in the present embodiment, the layout of the pair transistors can be given some allowance, and defects arising from densely arranged transistors can be avoided. A negative consequence is that the surface area in the column direction is considerably increased in comparison with a single-step configuration. However, when the positions of the pair transistors are offset in the row direction and the two transistors are partially overlapped in the column direction, as in the present embodiment, an increase in the surface area of the layout in the column direction of the pair transistors can be lessened and the size of a sense amplifier can be reduced.

In accordance with the present embodiment, a balanced design in terms of resistance and capacitance with respect to a pair of bit lines can be achieved because two pair transistors adjacent in the row direction have an axially symmetric relationship with respect to the column direction.

In accordance with the present embodiment, the group of pair transistors in the first active region 101A and the group of pair transistors in the second active region 101B are in a positional relationship in which the two groups are offset by substantially a single transistor. Therefore, the connection between the transistors and the bit lines can be assured while maintaining to the extent possible the linearity of the bit lines without considerable meandering. In other words, an optimal layout for pair transistors can be achieved.

The sense amplifier shown in the first embodiment has a folded bit line system, and a pair of bit lines BLnT and BLnB connected to a single pair transistor is in a layout in which the two are next to each other. However, the present invention may also be applied to a sense amplifier having an open bit line system.

Figure 4:
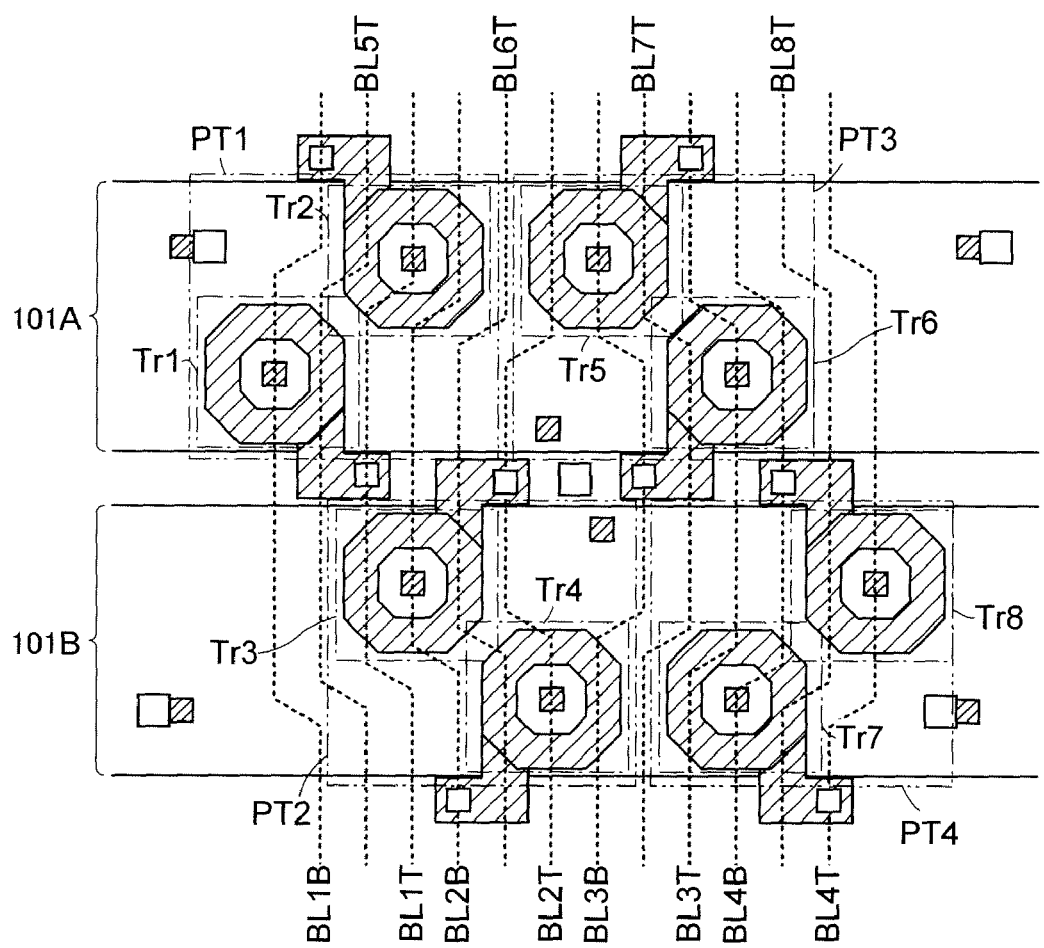
FIG. 4 is a schematic plan view showing the configuration of the semiconductor device according to the second embodiment of the present invention.

FIG. 4 is a schematic plan view showing the configuration of the semiconductor device according to the second embodiment of the present invention.

The present embodiment features the application of the present invention to a sense amplifier having an open bit line system, as shown in FIG. 4. Bit lines BL5T through BL8T connected to another sense amplifier disposed at a distance are therefore wired between a pair of bit lines. Other features of the configuration are substantially the same as the first embodiment and a detailed description is therefore omitted.

In the present embodiment, the positions of the pair transistors are shifted in the row direction and the pair transistors are partially overlapped in the column direction in the same manner as in the first embodiment. Accordingly, an increase in the surface area of the layout in the column direction can be reduced by the two-step configuration of the pair transistors, and the surface area of the layout of the sense amplifier can be reduced. The layout surface area can therefore be reduced in a sense amplifier having an open bit line system as well.

Figure 5:
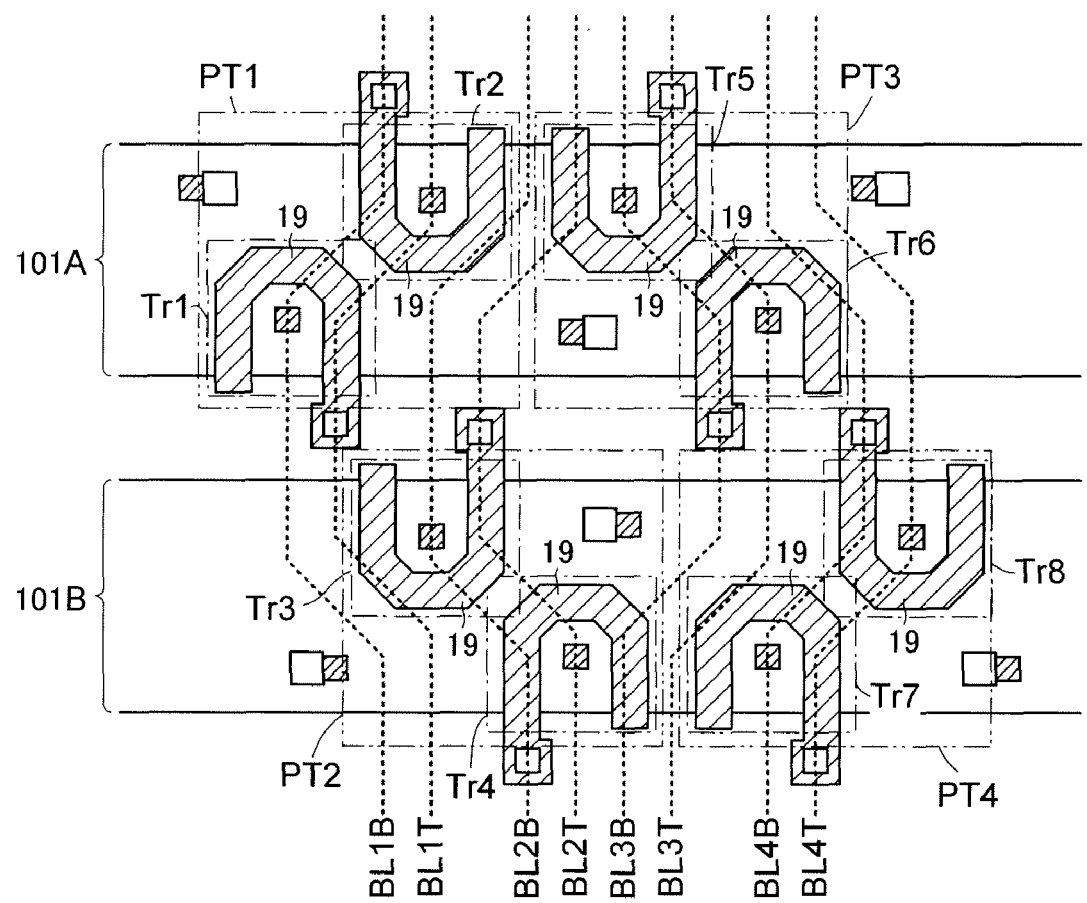
FIG. 5 is a schematic plan view showing the configuration of a semiconductor device according to the third embodiment of the present invention.
Figure 6:
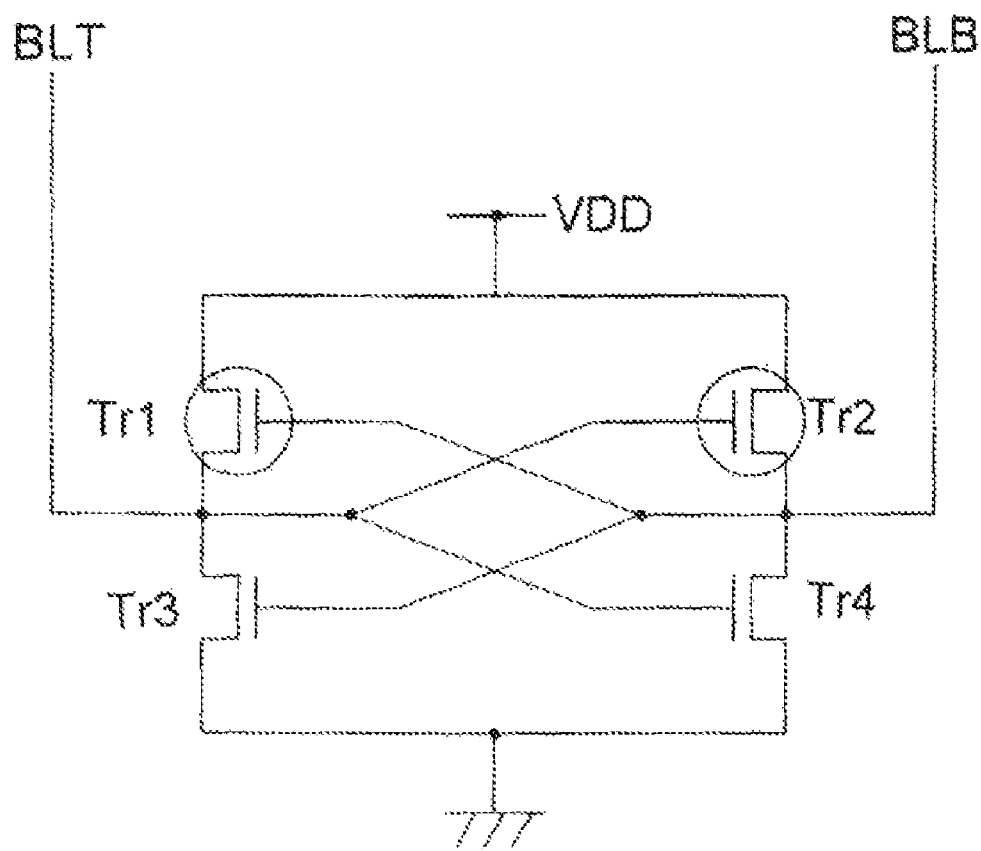
FIG. 6 is a circuit diagram showing the basic configuration of a sense amplifier.

FIG. 5 is a schematic plan view showing the configuration of a semiconductor device according to the third embodiment of the present invention.

As shown in FIG. 5, the present embodiment features U-shaped gates 19 in place of ring gates. Other features of the configuration are substantially the same as the first embodiment and a detailed description is therefore omitted.

In the present embodiment, the positions of the pair transistors are shifted in the row direction and the pair transistors are partially overlapped in the column direction in the same manner as the first embodiment. Accordingly, an increase in the surface area of the layout in the column direction can be reduced by the two-step configuration of the pair transistors, and the surface area of the layout of the sense amplifier can be reduced. The layout surface area can therefore be reduced in a sense amplifier provided with U-shaped gates.

The present invention is not limited to the embodiments described above, and various modifications can be made within a scope does not depart from the spirit of the present invention. Such modifications naturally remain within the scope of the present invention.

For example, in the embodiments described above, the groups of pair transistors are in a two-step configuration in the column direction, but the configuration may be one having three or more steps.

In the embodiments described above, the ring gates 11 of the transistors Tr1 and Tr2 constituting the pair transistors are disposed so as not to overlap in the row direction, but the present invention is not limited to such a configuration, and the gates of the pair transistors may have a mutually overlapping portion in the row direction.

In the embodiments described above, an example of pair transistors constituting a sense amplifier of a DRAM was described, but the present invention is not limited to a sense amplifier of a DRAM, and application can also be made to all other circuits that include a pair transistor.

What is claimed is:

1. A semiconductor device comprising a plurality of pair transistors each including a first transistor and a second transistor, the pair transistors being arrayed in a repeating pattern in a row direction, wherein
   a drain of the first transistor is connected to a gate of the second transistor;
   a drain of the second transistor is connected to a gate of the first transistor; and
   the gates of the pair transistors are in a diagonal positional relationship to each other so that the pair transistors are offset in the row direction and a column direction such that the positions of said pair transistors are shifted in the row direction so as to not overlap in the row direction and said pair transistors are shifted in the column direction so as to only partially overlap in the column direction.

2. The semiconductor device as claimed in claim 1, wherein the shortest distance between the gates of the pair transistors is set to be the minimum feature size.

3. The semiconductor device as claimed in claim 1, wherein the pair transistors adjacent in the row direction are in an axially symmetric relationship with respect to an axis in the column direction permitting a balanced design in terms of resistance and capacitance with respect to a pair of bit lines.

4. The semiconductor device as claimed in claim 1, wherein the pair transistors are MOS transistors, and the gates thereof are ring-shaped.

5. The semiconductor device as claimed in claim 1, wherein the pair transistors are MOS transistors, and the gates thereof are U-shaped.

6. The semiconductor device as claimed in claim 1, further comprising a pair of bit lines including first and second bit lines extending in the column direction, wherein
the drain of the first transistor is connected to the gate of the second transistor via the first bit line; and
the drain of the second transistor is connected to the gate of the first transistor via the second bit line.

7. The semiconductor device as claimed in claim 1, wherein the pair transistors are disposed in striped active regions extending in the row direction.

8. The semiconductor device as claimed in claim 1, wherein groups of pair transistors are arrayed in a repeating pattern in the row direction are disposed in multiple steps in the column direction.

9. The semiconductor device as claimed in claim 1, comprising:
a first group of pair transistors in which the pair transistors are arrayed in a repeating pattern in the row direction, and
a second group of pair transistors adjacently disposed in the column direction with respect to first group of pair transistors, wherein
the pattern of the first group of pair transistors and the pattern of the second group of pair transistors are positionally related so as to be offset substantially by a single transistor in the row direction.

10. A semiconductor device, comprising:
a first bit line pair extending in a column direction;
a first active region extending in a row direction; and
first and second transistors that are formed in the first active region and that amplify a difference in electric potential between the first bit line pair, wherein
gate electrodes of the first and second transistors both have a curved portion and are in a diagonal positional relationship to each other so that said first and second transistors are offset in the row direction and a column direction such that the positions of said first and second transistors are shifted in the row direction so as to not overlap in the row direction and said first and second transistors are shifted in the column direction so as to only partially overlap in the column direction.

11. The semiconductor device as claimed in claim 10, further comprising:
a second bit line pair disposed adjacent to the first bit line pair in the row direction;
a second active region disposed adjacent to the first active region in the column direction; and
third and fourth transistors that are formed in the second active region and that amplify a difference in electric potential between the second bit line pair, wherein
gate electrodes of the third and fourth transistors both have a curved portion and are in a diagonal positional relationship to each other so that said first and second transistors are offset in the row direction and a column direction such that the positions of said first and second transistors are shifted in the row direction so as to not overlap in the row direction and said first and second transistors are shifted in the column direction so as to only partially overlap in the column direction.

12. A semiconductor device comprising:
a plurality of pairs of bit lines, each of the pairs of bit lines including first and second bit lines each extending in a first direction, the pairs of bit lines being arranged in a second direction perpendicular to the first direction; and
a plurality of pairs of transistors, each of the pairs of the transistors including first and second transistors provided correspondingly to the first and second bit lines of an associated one of the pairs of bit lines, the first transistor having a gate and a drain coupled respectively to a drain and a gate of the second transistor, the gate of the first transistor being in a diagonal relationship with the gate of the second transistor such that the first transistor is offset in both of the first and second directions with respect to the gate of the second transistor while respective potions of the gates of the first and second transistors are shifted in the first direction so as to not overlap in the first direction and said pair transistors are shifted in the second direction so as to only partially overlap in the second direction.

13. The semiconductor device as claimed in claim 12, wherein the drain of the first transistor is coupled to the gate of the second transistor through a part of the first bit line, and the drain of the second transistor is coupled to the gate of the first transistor through a part of the second bit line.

14. The semiconductor device as claimed in claim 12, further comprising an active region defined by an insulating region, the active region extending in the second direction to accommodate the pairs of transistors.

15. The semiconductor device as claimed in claim 14, wherein each of the gates of the first and second transistors in each of the pairs of transistors being elongated over the insulating region beyond the active region to provide an elongated portion, and the semiconductor device further comprises a plurality of first contact plugs and a plurality of second contact plugs, each of the first contact plugs being connected to the elongated one of a corresponding one of the first transistors and each of the second contact plugs being connected to the elongated one of a corresponding one of the second transistors.

16. The semiconductor device as claimed in claim 12, further comprising first and second active regions isolated from each other and arranged in the first direction, each of the first and second active regions being elongated in the second direction, the pairs of transistors being divided into first and second groups, the pairs of transistors belonging to the first group being arranged in the first active region in the second direction, and the pairs of transistors belonging to the second group being arranged in the second active region in the second direction.

17. The semiconductor device as claimed in claim 12, further comprising first and second active regions isolated from each other and arranged in the first direction, each of the first and second active regions being elongated in the second direction, odd-numbered ones of the pairs of transistors being arranged in the first active region in the second direction and even-numbered ones of the pairs of transistors being arranged in the second active region in the second direction such that the gate of the second transistor of the odd-numbered ones of the pairs of transistors is substantially equal in position in the second direction to the gate of the first transistor of the even-numbered ones of the pairs of transistors.

18. The semiconductor device as claimed in claim 11, wherein the gates of the first, second, third and fourth transistors are ring-shaped.

19. The semiconductor device as claimed in claim 12, wherein the gates of the pair transistors are ring-shaped.

* * * * *